United States Patent
Lin et al.

(10) Patent No.: US 7,463,504 B2
(45) Date of Patent: Dec. 9, 2008

(54) ACTIVE FLOAT FOR THE DUMMY BIT LINES IN FERAM

(75) Inventors: Sung-Wei Lin, Plano, TX (US); Sudhir Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/227,936

(22) Filed: Sep. 15, 2005

(65) Prior Publication Data

US 2007/0058413 A1  Mar. 15, 2007

(51) Int. Cl.
*G11C 11/22* (2006.01)

(52) U.S. Cl. .................... 365/145; 365/149; 365/189.09

(58) Field of Classification Search ................ 365/145, 365/149, 189.09
See application file for complete search history.

(56) References Cited

U.S. PATENT DOCUMENTS

| | | | | |
|---|---|---|---|---|
| 6,046,928 | A * | 4/2000 | Takata | 365/145 |
| 6,356,475 | B1 * | 3/2002 | Tamura et al. | 365/145 |
| 6,407,943 | B1 | 6/2002 | Choi et al. | |
| 6,898,145 | B2 | 5/2005 | Winograd et al. | |
| 6,990,005 | B2 * | 1/2006 | Saito | 365/145 |
| 2006/0013033 | A1 * | 1/2006 | Yamamura | 365/145 |

* cited by examiner

*Primary Examiner*—Huan Hoang
(74) *Attorney, Agent, or Firm*—Wade J. Brady, III; Frederick J. Telecky, Jr.

(57) ABSTRACT

Methods are described for operating a FeRAM and other such memory devices in a manner that avoids over-voltage breakdown of the gate oxide in memory cells along dummy bit lines used at the edges of memory arrays, the methods comprising floating the dummy bit line during plate line pulsing activity. In one implementation of the present invention the method is applied to a FeRAM dummy cell having a plate line, a dummy bit line, a pass transistor, and a ferroelectric storage capacitor. The method comprises initially grounding the dummy bit line as a preferred pre-condition, however, this step may be considered an optional step if the storage node of the storage capacitor is otherwise grounded. The method then comprises floating the dummy bit line, activating a word line associated with the memory cell, and pulsing the plate line. Alternately, the method comprises applying a positive voltage bias to the dummy bit line in place of, or before floating the dummy bit line. The method may further optionally comprise grounding the dummy bit line after pulsing the plate line, and optionally disabling the word line after grounding the dummy bit line to precondition the cell for the next memory operation.

45 Claims, 10 Drawing Sheets

ACTIVE FLOAT FOR THE DUMMY BIT LINES IN FERAM

FIELD OF INVENTION

The present invention relates generally to the field of memory devices, and more specifically to a method of operating a Ferroelectric memory device that avoids over-voltage breakdown of the gate oxide in cells along dummy bit lines used at the edges of FeRAM arrays.

BACKGROUND OF THE INVENTION

Non-volatile ferroelectric RAM, commonly referred to as FeRAM or FRAM devices and other types of semiconductor memories, are used for storing data and/or program code in personal computer systems, embedded processor-based systems, and the like. FeRAM cells employ a ferroelectric capacitor (FeCap) including a pair of capacitor plates with a ferroelectric material, such as SBT or PZT, as the capacitor dielectric situated between them. Ferroelectric materials have two different stable polarization states that may be used to store binary information, where the ferroelectric behaviour follows a hysteresis curve of polarization versus applied voltage. FeRAM memory cells are non-volatile memory devices, because the polarization state of a FeCap remains when power is removed from the device.

Two types of memory cells are used commonly, a single capacitor memory cell and a dual capacitor memory cell. The single capacitor memory cell (a 1T/1C or 1C memory cell) requires less silicon area, thereby increasing the potential density of the memory array, but is less immune to noise, process and cycling variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell generally is more stable than a 1C memory cell.

As illustrated in prior art FIGS. 1A and 1B, a 1T/1C FeRAM cell 100 includes one transistor (also called pass or pass gate transistor) 112 and one ferroelectric storage capacitor 114. The storage capacitor 114 is connected to a source terminal 115 of the transistor 112. The 1 T/1 C cell 100 is read from by applying an X-axis or word line WL signal to the gate 116 of the transistor, thereby connecting the FeCap 114 to the drain of the transistor at the bit line BL 118. A pulse signal is then applied to the plate line PL 120.

The charge on the bit line 118 of the transistor 112 is, therefore, the FeCAP capacitor charge shared with the bit line capacitance and the potential on the bit line is the charge on the bit line divided by the bit line capacitance. Since the FeCAP capacitor charge is dependent upon the bi-stable polarization state of the ferroelectric material, the bit line potential can have two distinct values. A sense amplifier (see FIG. 3) is connected to the bit line 118 and detects the voltage at a storage node SN 125 of storage capacitor 114 associated with a logic or polarization value of either 1 or 0 of the FeCAP. Frequently, the sense amplifier reference voltage is provided by a "reference cell" (not shown), which comprises a ferroelectric or non-ferroelectric capacitor connected to another bit line that is not being read. In this manner, the memory cell data is retrieved.

Several additional memory devices have been developed utilizing FeCaps, such as the four transistor (4T) two capacitor (2C) non-volatile (NV) SRAM cell (4T/2C NV SRAM), and the FeCap based reference cell noted above.

Feature sizes of integrated circuits are continuously decreasing in order to increase the packing density and operating speed of the various semiconductor devices formed thereby. As feature sizes continue to shrink, however, one semiconductor fabricating process that experiences unique challenges is photolithography. Photolithography involves selectively exposing regions of a resist-coated silicon wafer utilizing a reticle (often called a mask) that includes a pattern thereon corresponding to features to be formed in a layer on the substrate.

It is well known in the art of photolithography that light passing through the reticle is refracted and scattered by the edges of the chrome mask patterns of the reticle, causing the projected image to exhibit some rounding and other forms of optical distortion. As feature scaling trends continue, variations of feature critical dimensions may no longer be ignored in present day circuit layouts. The problem highlighted above becomes even more pronounced in integrated circuit designs having submicron feature sizes near the wavelength of the radiation employed in the photolithographic process.

In addition, the diffraction and scattering of the radiation in the distorted illumination pattern propagates through the developed resist pattern and negatively impacts the integrated circuit features, such as polysilicon gate regions, vias in dielectrics, etc. As a result, integrated circuit performance is often degraded.

To mitigate this problem, a reticle correction technique known as optical proximity correction (OPC) has been developed. OPC involves the adding of dark regions to and/or the subtracting of dark regions from portions of a reticle to mitigate the distorting effects of diffraction and scattering. Typically, OPC is performed on a digital representation or simulation of a desired integrated circuit pattern. The digital representation is often referred to as the mask layout data and is used by the reticle manufacturer to generate the reticle. First, the mask layout data is evaluated with software to identify regions where optical distortion will result. Then the OPC is applied to compensate for the distortion. The resulting pattern is ultimately transferred to the reticle glass.

Various corrections or modifications are made to the base features of the design layout to compensate for the optical distortions produced by the imaging effects. In addition, variations in the photoresist and other such imaging material processing cause damage to the features as fabricated, and degradations from the layout design add to the CD variation and failure rate of a targeted CD for a feature. Imaging material processing is complex and difficult to model in OPC designs. Further, other post patterning processes such as etch and cleaning operations are equally difficult to model in OPC designs and cause substantial CD variation of the desired features.

Because these difficulties may persist in the best of OPC models and such methods may not provide adequate correction for the various processes, dummy rows and columns of repeating features are often beneficially used around the edges or boundary of the core region of memory arrays. Dummy rows and dummy columns placed at the edges of memory arrays help maintain the same pattern uniformity as the adjacent interior rows and columns of array features or elements. For a typical memory array, a dummy row may comprise a dummy wordline and the associated dummy memory cells and select circuits, while a dummy column may comprise a dummy bit line (or a pair of dummy bit lines) as well as the associated sense amplifier circuit and dummy memory cells.

During memory array operations, dummy rows and columns are typically deactivated, as these dummy elements usually do not represent the operational characteristics of the interior rows and columns. Although they are sacrificed for the greater good of the array operationally, however, such dummy rows and columns may impose additional failure risks to the remainder of the array wherever row and column lines or power supply lines are shared in common. For example, a failed dummy cell connected to a shared word line, may disable that wordline for the entire array.

Accordingly, there is a need for a method of operating a FeRAM and other such memory devices to avoid failures in dummy elements used at the edges of the array while avoiding special OPC methods or design considerations in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods of operating a FeRAM and other such memory devices to avoid over-voltage breakdown of the gate oxide in memory cells along dummy bit lines used around the core region boundary of memory arrays. The methods avoid an over-voltage condition on the gate of a dummy cell pass transistor, by floating (e.g., ungrounding) the dummy bit line during plate line pulsing activity. This "active float method" prevents or minimizes the magnitude of a negative voltage from being produced at the storage node due to capacitive coupling from the negative going edge of a plate line pulse, thereby avoiding a damaging over-voltage of the gate to source voltage Vgs of the pass transistor. Any Vgs voltage exceeding the gate supply voltage VWL, is not desired from the reliability point of view and is considered over-voltage.

The methods of the present invention are applicable to FeRAM devices and other such memory technologies and architectures having a plate line, a dummy bit line, a pass transistor, and a storage capacitor. The methods are also applicable to silicon wafer fabrication and other such fabrication processes in the manufacture of semiconductor devices. It will be appreciated in the context of the present invention that "during plate line pulsing activity", may include floating the dummy bit line before, or coincident with, the beginning edge of the plate line pulse, and may further include re-grounding the dummy bit line after, or coincident with, the trailing edge of the plate line pulse.

In the past, dummy bit lines were grounded all the time to simply disable the dummy cells and dummy bit line circuitry. The present invention, however, controls the action of the dummy bit lines during plate line pulsing activity to prevent or minimize the over-voltage conditions on the pass transistor which may cause a break-down of the gate oxide.

The inventors of the present invention have realized that, although the storage capacitor of a FeRAM cell capacitively couples the plate line to the storage node, the maximum voltage across the gate of the pass transistor will be substantially unaffected by the plate line if the bit line is allowed to float freely during plate line pulsing in accordance with the present invention. Thus, the gate to source voltage should not exceed VWL, and an over-voltage is avoided or minimized.

In one aspect of the invention, the memory operation utilizing the active float method is applied to a FeRAM dummy memory cell having a plate line, a dummy bit line, a pass transistor, and a ferroelectric storage capacitor. The method comprises initially grounding the dummy bit line associated with the memory cell, floating the dummy bit line, activating a word line associated with the memory cell after floating the dummy bit line, and pulsing the plate line after activating the word line. The method may further comprise grounding the dummy bit line after pulsing the plate line, and disabling the word line after grounding the dummy bit line in order to precondition the cell for the next memory operation.

In another aspect of the invention, the method comprises initially grounding the dummy bit line associated with the memory cell, activating a word line associated with the memory cell to ground a storage node of the ferroelectric storage capacitor, floating the dummy bit line, and pulsing the plate line after floating the dummy bit line. The method may further comprise grounding the dummy bit line after pulsing the plate line, and disabling the word line after grounding the dummy bit line in order to precondition the cell for the next memory operation.

In another aspect of the present invention, the dummy bit line is grounded whenever the plate line is not pulsing.

In another aspect of the present invention, the method may comprise applying a positive voltage bias to the dummy bit line in place of, or before floating the dummy bit line.

In yet another aspect of the present invention, a bit line precharge transistor (e.g., in the associated sense amplifier circuit) is used for floating and grounding the dummy bit line.

In another aspect of the present invention, the pass transistor used in the dummy cell(s) is an n-channel transistor.

In still another aspect of the invention, one or more dummy bit lines are used around the core region boundary of the memory array, such as an FeRAM array.

In yet another aspect of the present invention, the dummy memory cell is a FeRAM memory cell, and the storage capacitor is a ferroelectric capacitor.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
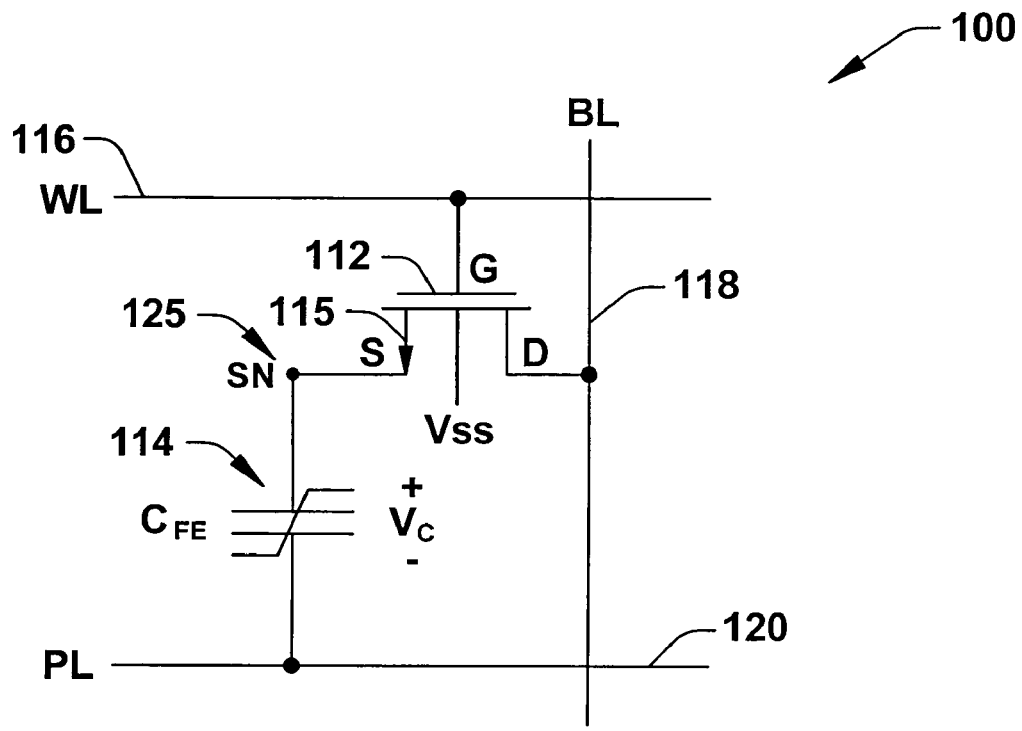
FIG. 1A is a prior art schematic diagram of an exemplary 1T/1C FeRAM memory cell such as may be used in accordance with the present invention.

The present invention will now be described with reference to the attached drawings, wherein like reference numerals are used to refer to like elements throughout. The invention provides methods of operating a FeRAM and other such memory devices that avoid over-voltage breakdown of the gate oxide in the pass transistor of memory cells along dummy bit lines used at the core region boundary of memory arrays. The methods float the dummy bit line during plate line pulsing activity so that a negative going plate line voltage will not couple or will minimize an over-voltage across the gate of a pass transistor of the memory cell. Alternately, a positive voltage bias may be applied to the dummy bit line in place of, or prior to floating the bit line to reduce the gate to source and the gate to drain voltage when the plate line is pulsed.

Exemplary implementations are hereinafter illustrated and described in the context of providing methods for operating a dummy memory cell within a ferroelectric memory array and other such memory devices, wherein the memory cells are protected from over-voltage conditions on the gate of the memory cell pass transistor by floating the dummy bit line associated with the cells during plate line pulsing activity, and wherein the structures illustrated are not necessarily drawn to scale. It will be appreciated that the invention may be employed in FeRAM, DRAM, as well as in SRAM and other such memory devices and memory technologies apart from the exemplary devices described and illustrated herein. These and other benefits will become more apparent as the following figures are described. The following discussion will further establish some of the problems and issues relating to layout density associated with the proximity correction of mask designs used in wafer and device fabrication.

As semiconductor device scaling continues, and as previously discussed, columns of dummy bit lines, and rows of dummy word lines are often used around the edge or boundary of a memory array to mitigate inadequacies in even the best OPC models that may not provide adequate correction for post processing such as etch and clean processes or imaging material processing such as photoresist processes used in the fabrication of semiconductor devices.

Figure 2:
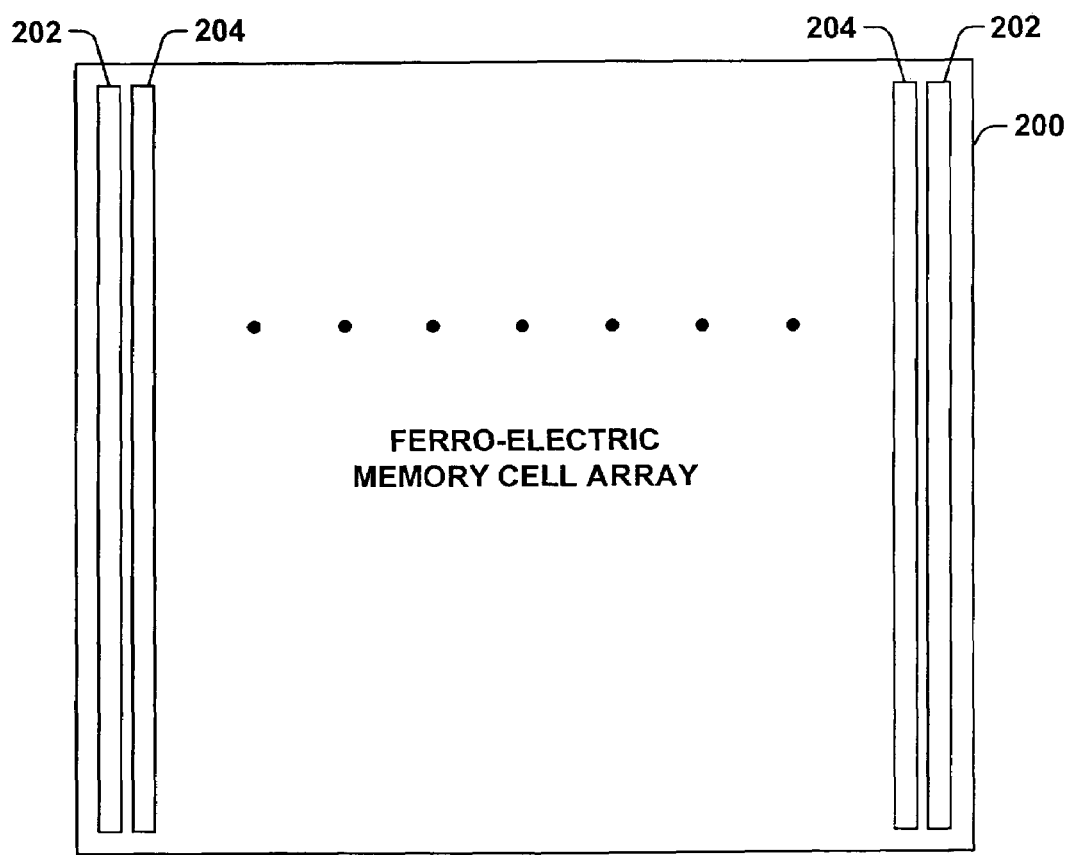
FIG. 2 is a partial plan view of a core region of a FeRAM array, wherein dummy bit lines are utilized and illustrated on both edges of the array to mitigate processing and imaging correction difficulties.

FIG. 2, for example, illustrates a core region 200 of a FeRAM array, wherein dummy bit lines are utilized on the edges or boundaries of the array to mitigate processing and imaging correction difficulties. The core region 200 comprises an array of memory cells arranged in a plurality of columns of cells arranged along bit lines, and a plurality of rows of cells arranged along word lines. The plurality of columns, for example, comprises one or more exterior or edge columns 202 and a plurality of interior columns 204. Each of the plurality of columns may comprise a plurality of memory cells, a pair of complimentary bit lines, a sense amplifier circuit, and associated switching and isolation circuitry. The plurality of columns 202 and 204, are patterned identically, however, the cells of the edge columns 202 are unused and as such are referred to as dummy memory cells arranged along a dummy bit line within dummy columns 202. The use of the dummy columns 202 avoids the use of special OPC conditions at the core boundaries by maintaining the same pattern uniformity as the adjacent interior cell columns 204.

Figure 3:
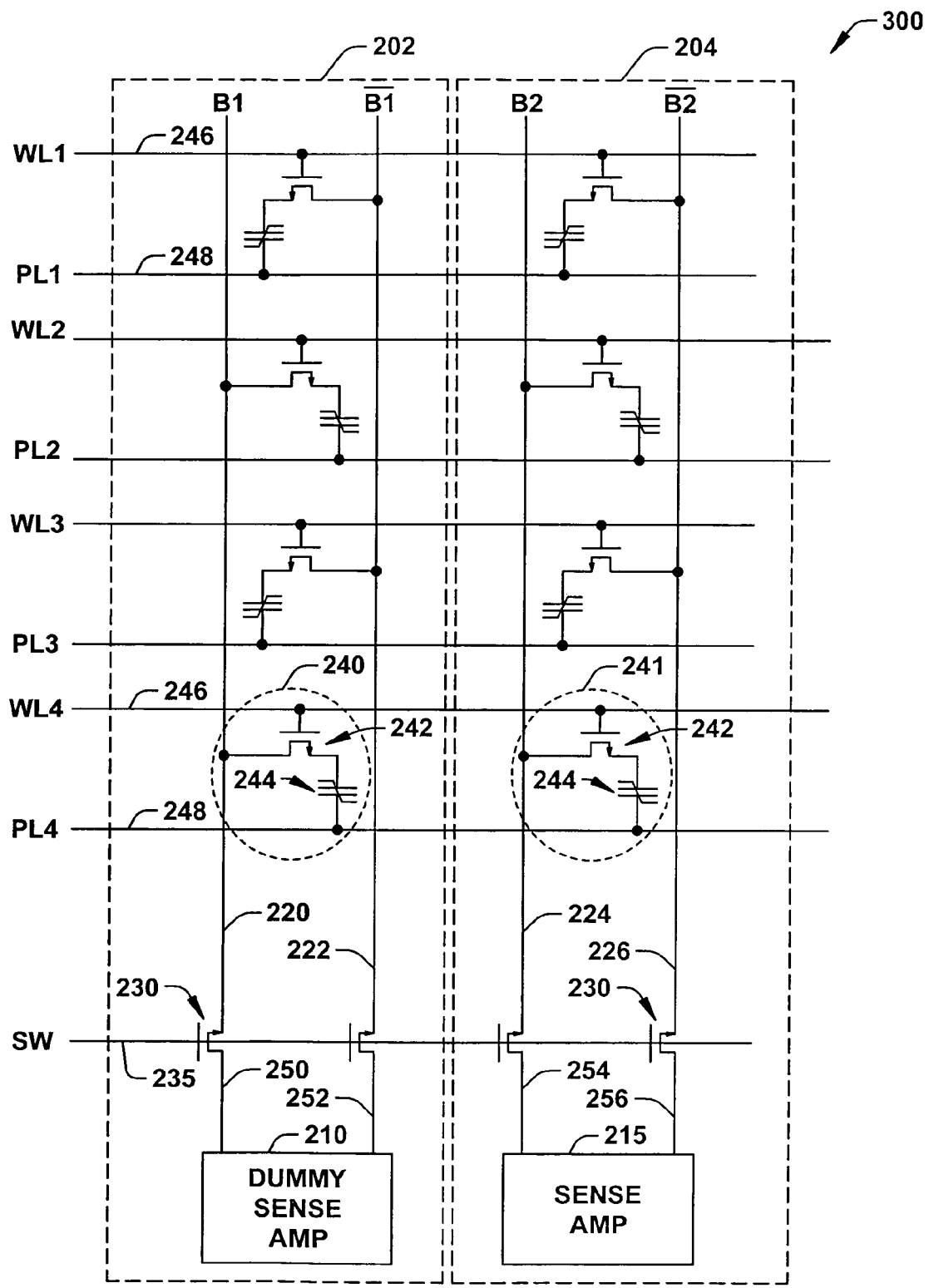
FIG. 3 is a simplified schematic illustrating an array portion of the prior art 1T/1C memory cell structure of FIGS. 1A and 1B.

For example, FIG. 3 illustrates an array portion 300 of the prior art 1T/1C memory cell structure of FIG. 1A. FIG. 3 also illustrates further details of the dummy columns 202 and the interior (or conventional) columns 204. Array portion 300 has a plurality of element groupings arranged in columns which operate together in a modular fashion to read and write to memory cells. FIG. 3, for example, shows a dummy column element grouping 202 and an interior column element grouping 204. In accordance with the present invention, the dummy column 202 topographically duplicates the interior columns 204 to avoid special OPC conditions; however, most cell and sense functions of the dummy column 202 are disabled. The column or element groupings comprise a dummy sense amplifier 210, which is used to ground a pair of dummy bit lines B1 220 and B1-bar 222 associated with a dummy memory cell 240, while a conventional sense amplifier 215 is used to sense a memory cell 241 associated with a pair of conventional bit lines B2 224 and B2-bar 226, respectively. The memory cells are accessed by one of a plurality of word lines 246 (W1-W4) and plate lines 248 (PL1-PL4), with each word line and associated plate line activating a 1T1C dummy memory cell 240 and accessing a memory cell 241.

Dummy column 202, for example, comprises a dummy sense amplifier 210, coupled to a pair of dummy bit lines B1 220 and B1-bar 222 through a set of bit line isolation transistors 230 controlled by an isolation switch line 235, to permit isolation of the dummy bit lines from the dummy sense amplifier 210. The 1T1C dummy memory cell 240 comprises a pass gate transistor 242 and a ferroelectric capacitor 244, which is accessed by its respective word line 246 and plate line 248. Bit line isolation transistors 230 isolate the local dummy bit lines (B1 220 and B1-bar 222) from the dummy sense amplifier bit lines DSABL 250 and 252 at the dummy sense amplifier 210. Although some functions are described above in the context of the dummy column 202, only the conventional internal columns 204 are fully functional in the present invention, while most cell and sense functions of the dummy column 202 are disabled.

Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric capacitors (FeCaps) adapted to store a binary data bit, as well as one or more access transistors, typically MOS devices, operable to selectively connect the FeCap to a bit line or one of a pair of complimentary bit lines, with the other bit line being connected to a reference voltage. The individual FeRAM cells are commonly organized as individual bits of a corresponding data word, wherein the cells of a given word are accessed concurrently through activation of plate lines and word lines by address decoding circuitry.

Data in a 1T1C ferroelectric memory cell is read by connecting a reference voltage to a first bit line, connecting the cell capacitor between a complimentary bit line and a plate line signal voltage, and interrogating the cell. There are several techniques to interrogate a FeRAM cell. Two most common interrogation techniques are step sensing and pulse sensing. In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage is typically supplied at an intermediate voltage between a voltage associated with a capacitor programmed to a binary "0", and that of the capacitor programmed to a binary "1". The resulting differential voltage at the sense amp terminals represents the data stored in the cell, which is buffered and applied to a pair of local IO lines.

The transfer of data between the FeRAM, the sense amp circuit, and the local data bit lines is controlled by various access transistors, typically MOS devices, with switching signals being provided by control circuitry in the device. In a typical ferroelectric memory read sequence, two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

As indicated previously, in a prior art, dummy bit lines were grounded during all memory operations to disable the dummy cells (e.g., dummy cell 100 of FIG. 1A) and dummy bit line circuitry 118. With a grounded bit line 118, however, a negative voltage spike could develop at the SN 125 because of the finite ON resistance, RdsON, of the pass transistor 112 when the PL 120 falls from an ON value of 1.5V to 0V. Any negative spike on the SN 125 can increase the WL 116 to the SN 125 voltage. In the example in the FIG. 4, it is in excess of 2.3V and is considered an over-voltage (over the acceptable value of VWL of 2.1V in this case).

Figure 1B:
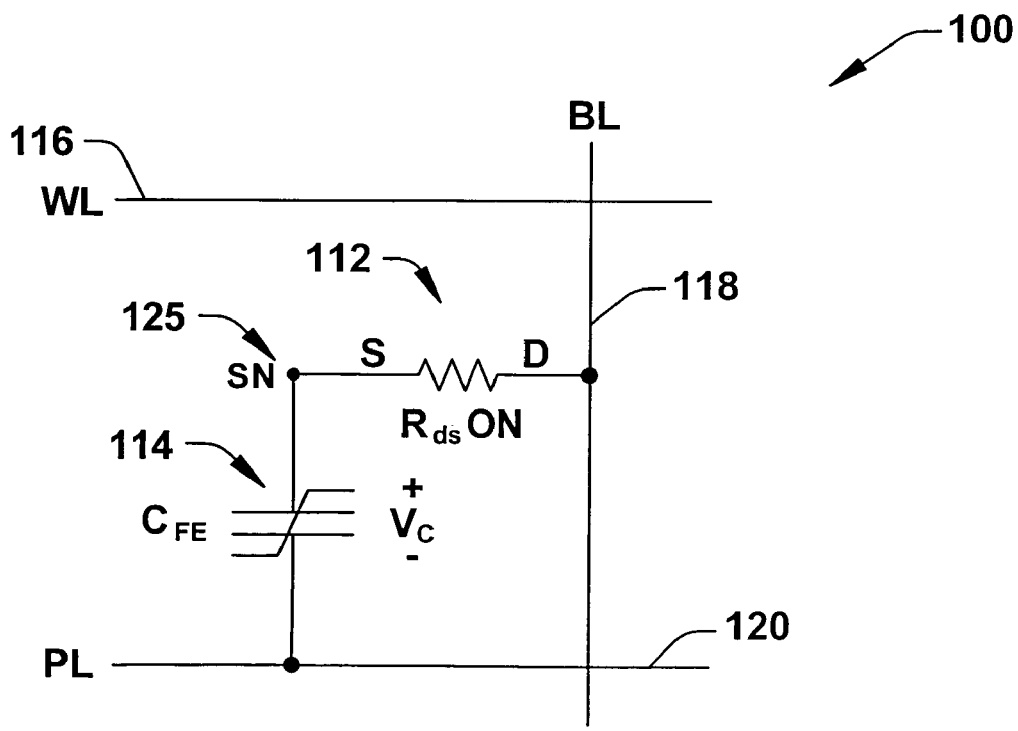
FIG. 1B is an equivalent prior art schematic diagram of the exemplary 1T/1C FeRAM memory cell of FIG. 1A during conduction of the pass transistor.

For example, FIG. 1B illustrates the equivalent circuit of FIG. 1A when pass transistor 112 is conducting, providing an equivalent on-resistance RdsON 112 between the bit line 118 and the storage node 125. Because of this series on-resistance, the grounded bit line 118 will not be able to hold the storage node SN 125 at a solid ground potential. Then, when the plate line PL 120 rises, the storage node SN 125 is coupled high. Since the plate line PL 120 to word line WL 116 coupling due to parasitic capacitances is less than the coupling between the plate line PL 116 and the storage node SN 125, the voltage difference between the word line WL 116 and the storage node SN 125 is less than the word line voltage VWL. Thus, no problem is created when the storage node SN 125 is coupled up by a pulse on the plate line PL 120.

However, the charge at the storage node SN 125 can be slowly discharged to ground through the pass transistor if the bit line BL 118 is grounded. Then, when the plate line pulse starts to go low, the grounded storage node SN 125 may go negative due to the SN 125 to PL 120 capacitive coupling of the storage capacitor. This will make the voltage difference between the WL 116 and the SN 125 higher than the word line voltage VWL. The over-voltage on the gate of the memory cell pass transistor 112 may damage the gate oxide.

Figure 4:
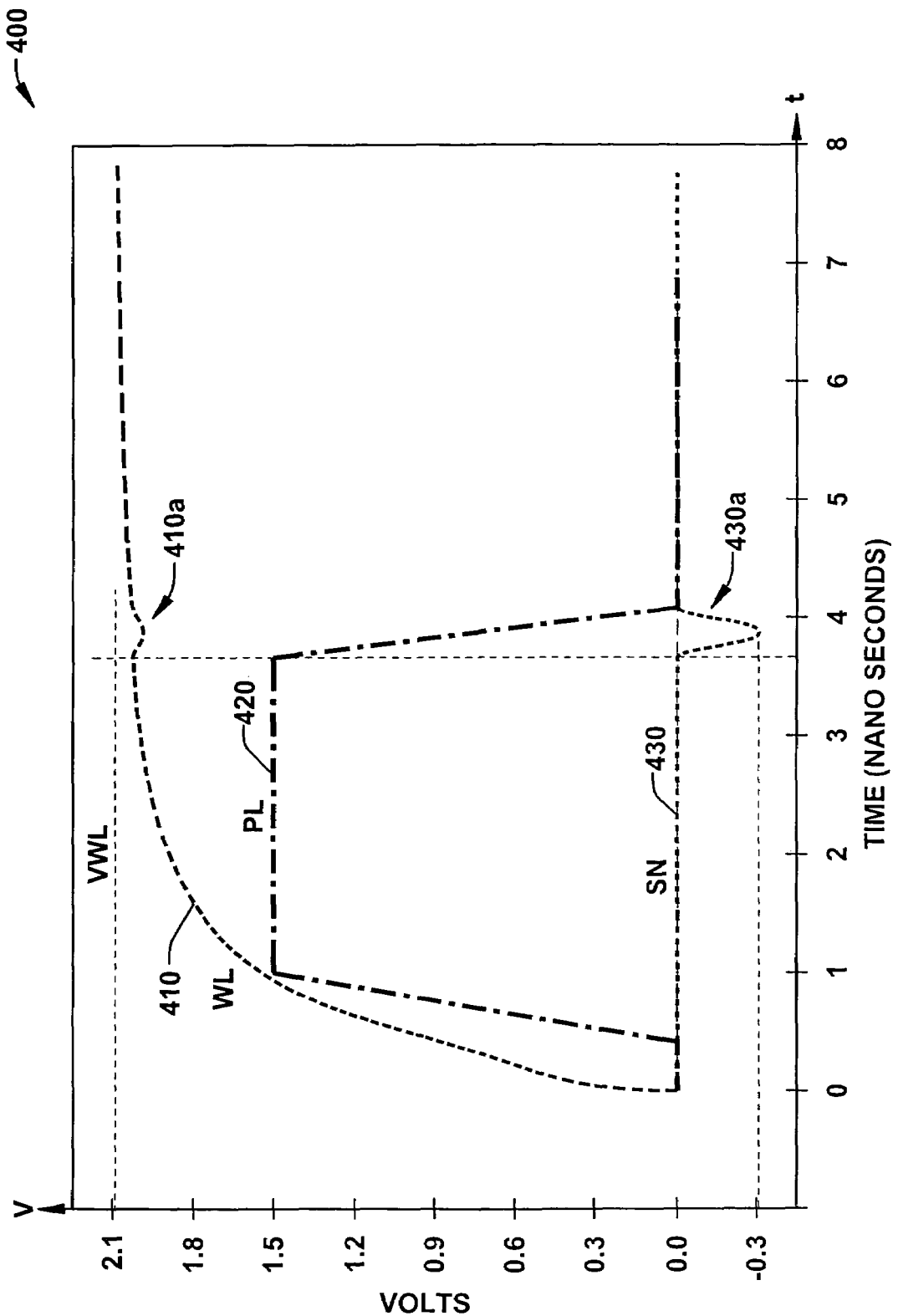
FIG. 4 is a plot of a word line, a plate line, and a resulting storage node negative voltage that may occur in the prior art 1T/1C FeRAM memory cell of FIGS. 1A and 1B according to a prior art memory operation method.

FIG. 4 illustrates a plot 400 of a word line 410, a plate line 420, and a resulting storage node voltage 430 that may occur in the prior art 1T/1C FeRAM memory cell of FIGS. 1A and 1B according to a prior art memory operation method. For example, plot 400 illustrates that initially, the word line 410, the plate line 420, and the storage node voltage 430 is initially grounded (0.0 Volts). The word line WL 410 is then charged toward VWL (about 2.1 volts) while the plate line PL 420 pulses to Vdd about 1.5 volts. As the plate line PL 420 pulse returns again to 0 volts, the negative going edge capacitively couples to the storage node voltage SN 430, producing a negative pulse of about −0.32 volts 430a because of the on-resistance (e.g., RdsON 112 of FIG. 1B), and a slight negative going bump 410a on the word line WL 410. The net result of the capacitive coupling between the PL 420 and the SN 430 is that an over-voltage of about 2.32 volts is produced across the gate to source (Vgs) of pass transistor 112, that may damage the gate oxide of pass transistor 112.

Figure 5:
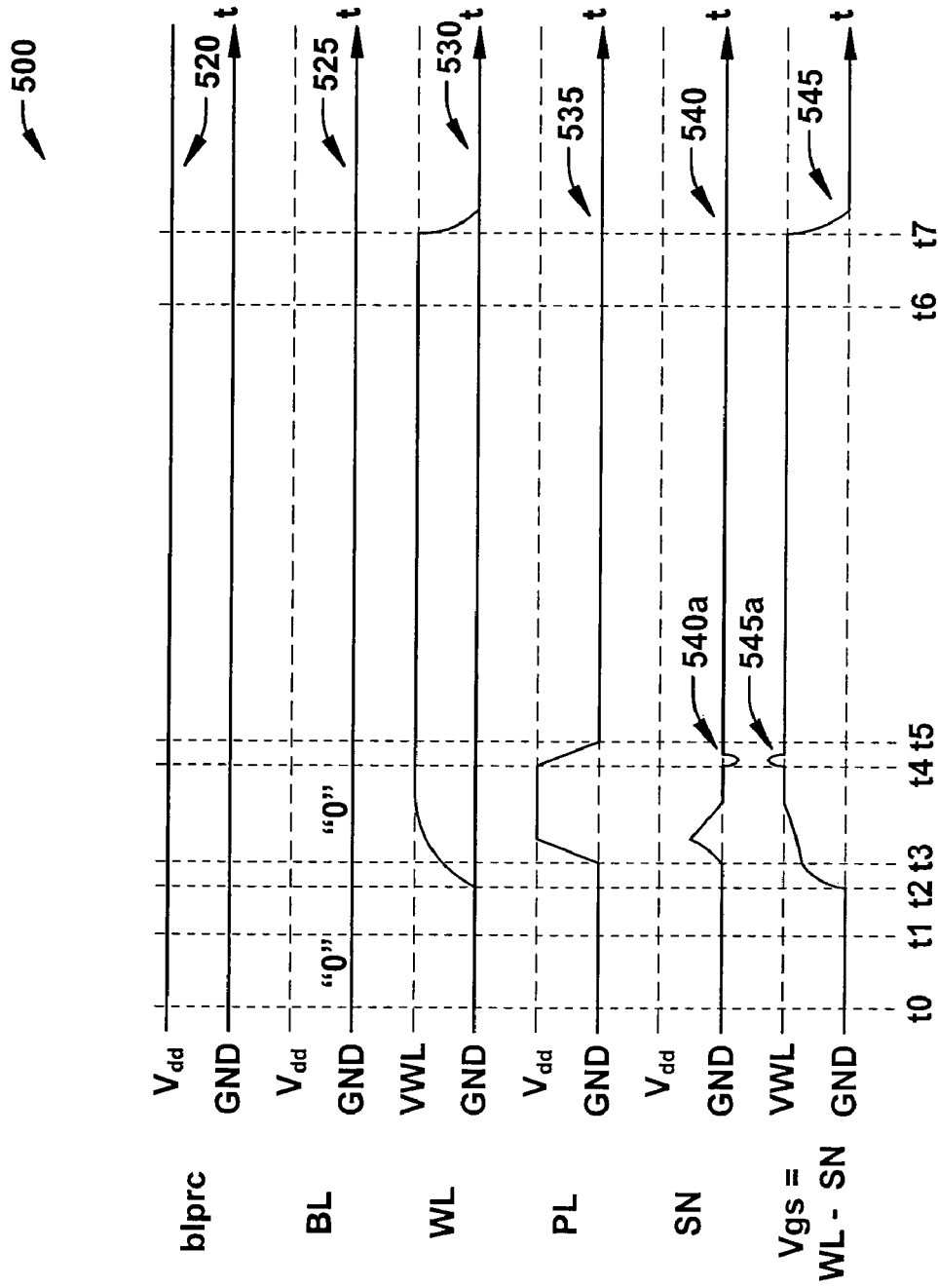
FIG. 5 is a timing diagram of a prior art memory operation method, wherein a gate to drain voltage over voltage condition may occur in the prior art 1T/1C FeRAM memory cell of FIGS. 1A and 1B, that could damage the gate oxide of the pass transistor.

For example, FIG. 5 illustrates a timing diagram of a prior art memory operation method 500 for a dummy column 202, wherein a gate to source over voltage condition may occur in the prior art 1T/1C FeRAM memory cell 100 of FIGS. 1A and 1B, that could damage the gate oxide of the pass transistor 112 of the dummy memory cell.

In the prior art method 500, a bit line precharge transistor by way of a bit line precharge signal blprc 520 may be used to initially ground a bit line (e.g., bit line 118 of FIG. 1A) bit line signal BL 525 at time t0. At time t2, a word line signal WL 530 is applied to the word line 116, which begins charging toward a word line voltage VWL, while the plate line 535 and the storage node voltage SN 540 are initially at ground. Thus, the gate to source voltage Vgs 545 differential between WL 530 and SN 540 also begins to increase at t2.

At time t3 the positive going edge of the plate line pulse PL 535 occurs and the storage node SN 540 begins charge sharing with the Bit line BL 525 until the plate line PL 535 pulse stops increasing, and at which time SN 540 discharges back to ground via the bit line BL 525.

At time t4, the negative going edge of the plate line pulse PL 535 capacitively coupled to the storage node (125) causes a negative voltage pulse 540a to occur on the SN 540, and is seen as an over-voltage condition 545a of greater than VWL (e.g., 2.32 volts) on the pass transistor 112 gate voltage Vgs 545. The negative voltage pulse 540a may continue until t5 when the plate line pulse PL 535 again reaches ground and storage node 125 is discharged to ground through the pass transistor 112.

Thereafter, at time t7 the word line voltage signal WL 530 is disabled, and together with gate voltage Vgs 545 discharges to ground.

Figure 6:
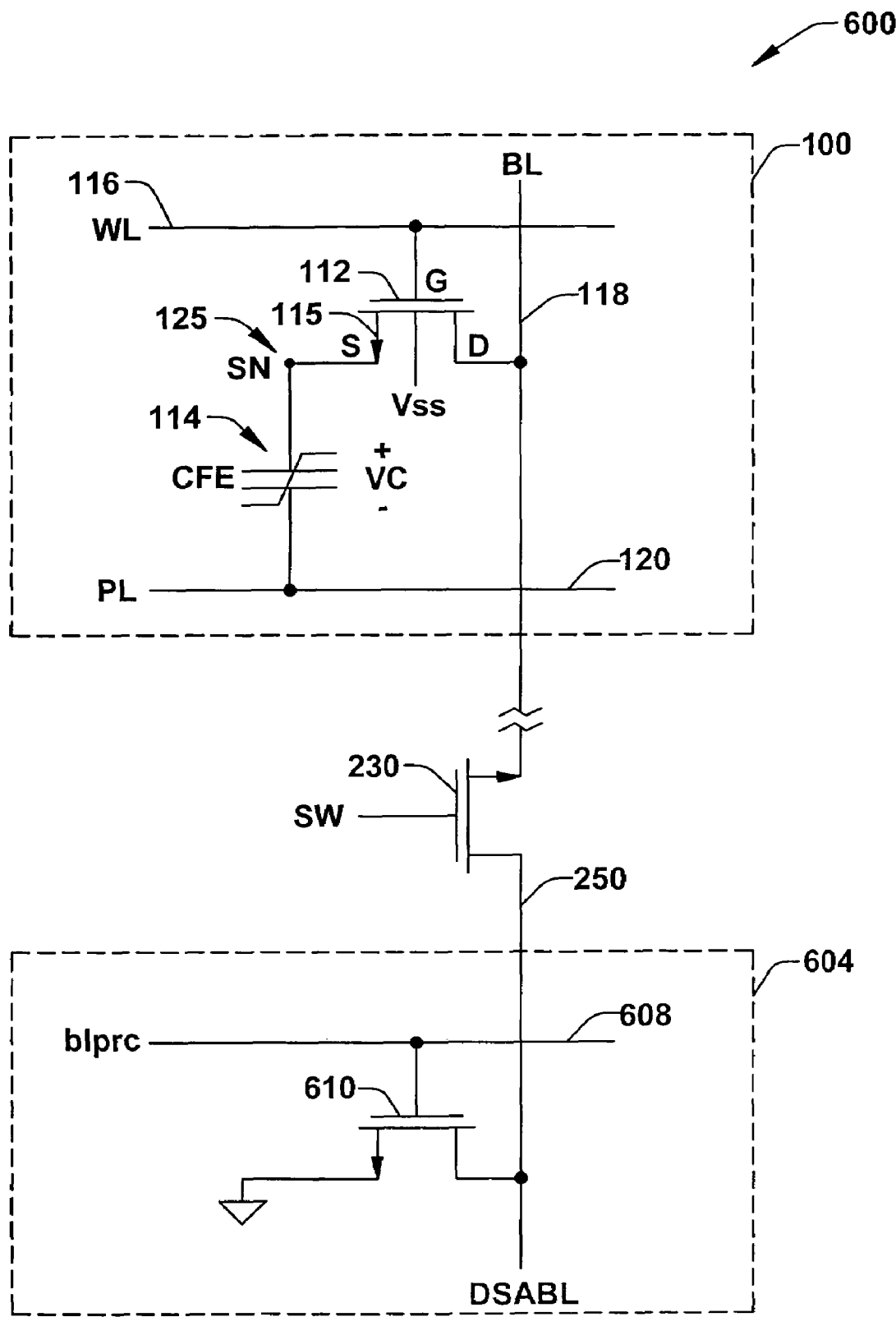
FIG. 6 is a partial schematic illustration of the 1T/1C FeRAM cell of FIG. 1A including the dummy bit line, a bit line isolation transistor, and the bit line precharge transistor within the dummy sense amplifier circuit, the bit line precharge transistor used to ground the dummy bit line during memory operations.

FIG. 6 illustrates various elements of a dummy column 202 using the 1T/1C FeRAM cell of FIG. 1A including the dummy bit line 118, a bit line isolation transistor 230, and a bit line precharge transistor 610 within the sense amplifier circuit 604. Bit line isolation transistor 230 isolates the local bit line BL 118 from a dummy sense amplifier bit line DSABL 250 at the sense amplifier 604. The bit line precharge transistor 610 via bit line precharge line blprc 608 is used to ground the dummy bit line 118 during prior art memory operations similar to those of method 500 of FIG. 5, by applying Vdd to blprc 608.

In response to the over-voltage problem described above, however, the present invention is presented for control of the dummy bit lines BL 118 during plate line PL 120 pulsing activity to prevent the over-voltage conditions on the pass transistor 112 which may cause a break-down of the gate oxide.

The inventors of the present invention have realized that, although the storage capacitor FeCap 114 of a FeRAM cell 100 capacitively couples the plate line PL 120 to the storage node SN 125, the maximum gate to source voltage Vgs of the pass transistor will be substantially minimized or unaffected by the plate line PL 120 if the bit line BL 118 is allowed to float freely during plate line PL 120 pulsing in accordance with the present invention. Thus, the gate to source voltage Vgs should not exceed VWL, whereby an over-voltage is avoided or minimized.

Beneficially, the bit line precharge line blprc 608 and bit line precharge transistor 610 of FIG. 6 may also be used in the active float method of the present invention to unground the bit line BL 118, thereby allowing the bit line BL 118 to float during plate line PL 120 pulsing activity. The active float method will now be discussed in association with the timing diagram of FIG. 7 and the methods illustrated in FIGS. 8-10 infra.

Figure 7:
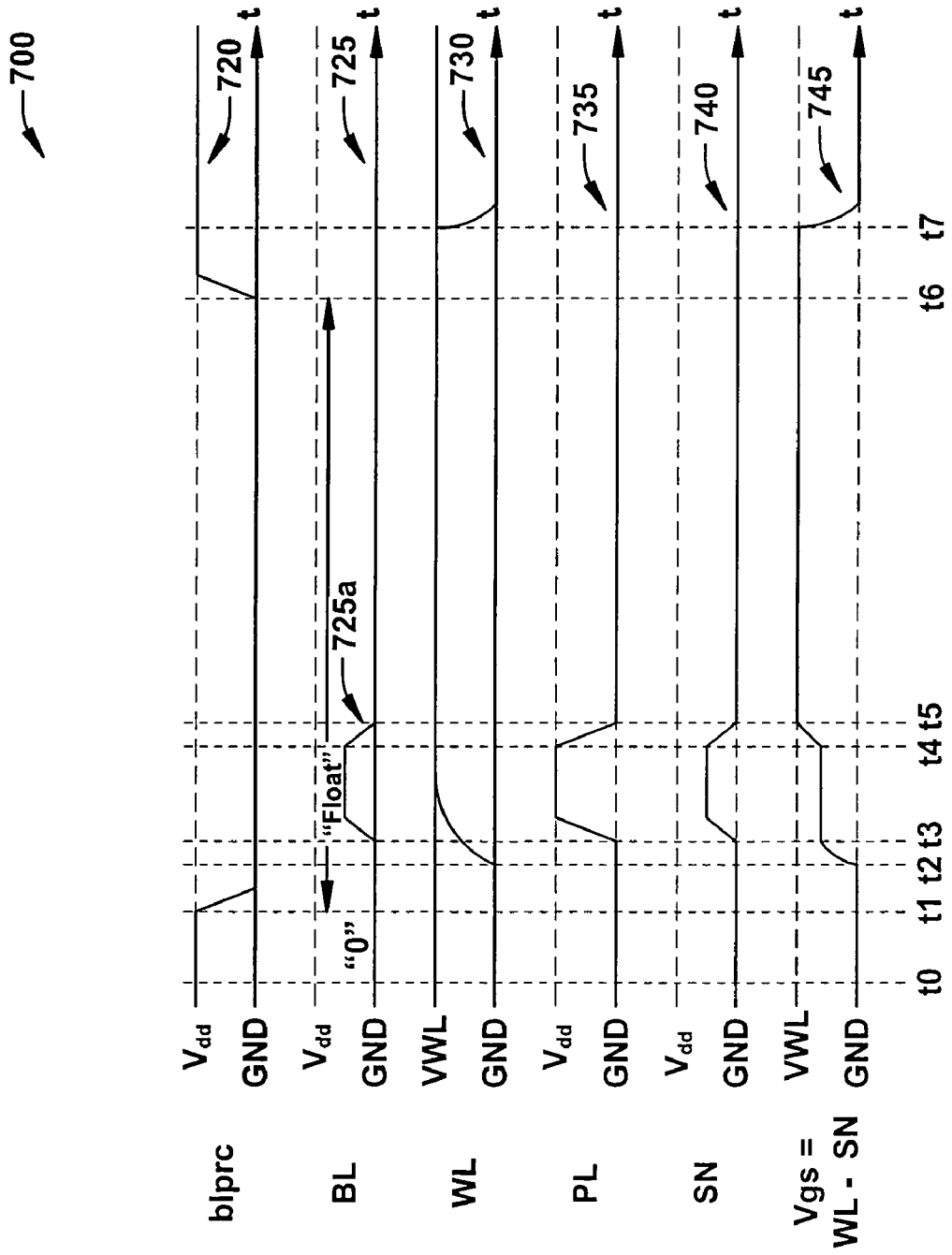
FIG. 7 is a timing diagram of an exemplary memory operation utilizing the method of the present invention, wherein the dummy bit line is floated during plate line pulsing activity, and wherein a gate to drain over voltage condition does not occur in the 1T/1C FeRAM memory cell of FIGS. 1A and 1B, thereby avoiding damage to the gate oxide of the pass transistor.

FIG. 7 illustrates a timing diagram of an exemplary memory operation utilizing the method 700 of the present invention, wherein the dummy bit line BL 118 is floated during plate line PL 120 pulsing activity, whereby a gate to source over voltage condition does not occur in the 1T/1C FeRAM memory cell 100 of FIGS. 1A and 1B, and damage to the gate oxide of the pass transistor 112 is avoided. Floating the bit line during plate line pulsing prevents the storage node SN 125 from going to a negative voltage due to coupling with the plate line PL 120 at the falling edge of the plate line PL 120 pulse.

In the active float method 700 of the present invention, a bit line precharge transistor (e.g., 610 of FIG. 6) by way of a bit line precharge signal blprc 720 may be used to initially ground a bit line (e.g., bit line 118 of FIG. 6) and shown in bit line signal BL 725 at time t0. At time t1 the bit line precharge signal blprc 720, via blprc transistor 610, floats the bit line BL 118. Bit line signal BL 725, however, will generally remain near ground as shown, until capacitively coupled high by the PL 735 at t3.

At time t2, a word line signal WL 730 is applied to the word line 116, which begins charging toward a word line voltage VWL, while the plate line 735 and the storage node voltage SN 740 are initially at ground. Thus, the gate to source voltage Vgs 745 differential between WL 730 and SN 740 also begins to increase at t2.

At time t3 the positive going edge of the plate line pulse PL 735 occurs and the storage node SN 740 begins charge sharing with the bit line BL 725 until the plate line PL 735 pulse stops increasing, at which time SN 740 stops charging without discharging to ground, because the bit line BL 725 is now floating in the method of the present invention. Because SN 740 is capacitively coupled to PL 735, and the bit line voltage BL 725 is floated at t3, BL 725 (as shown at 725a) basically follows the voltage levels of SN 740.

At time t4, the plate line pulse PL 735 returns back to ground level, and capacitively coupled to the storage node (125), pulls SN 740 and BL 725 back toward ground by time t5. Thus, BL 725 harmlessly floats when PL 735 pulses.

At time t5, the gate voltage Vgs 745 on pass transistor 112 has reached its maximum voltage, but without an over-voltage condition of greater than VWL, thanks to the active bit line float method of the present invention.

If the PL 735 ramp rate from t4 to t5 is very fast, a negative voltage spike can still develop at SN 740 because of the pass transistor ON resistance, RdsON. However, the magnitude of the negative voltage spike would be smaller compared to the prior-art case wherein the dummy bit line is grounded.

At time t6 blprc 720 again instructs blprc transistor 610 to ground the bit line 118 as shown by BL 725 at ground.

Thereafter, at time t7 the word line voltage signal WL 730 is disabled, and together with gate voltage Vgs 745 discharges to ground.

Figure 8:
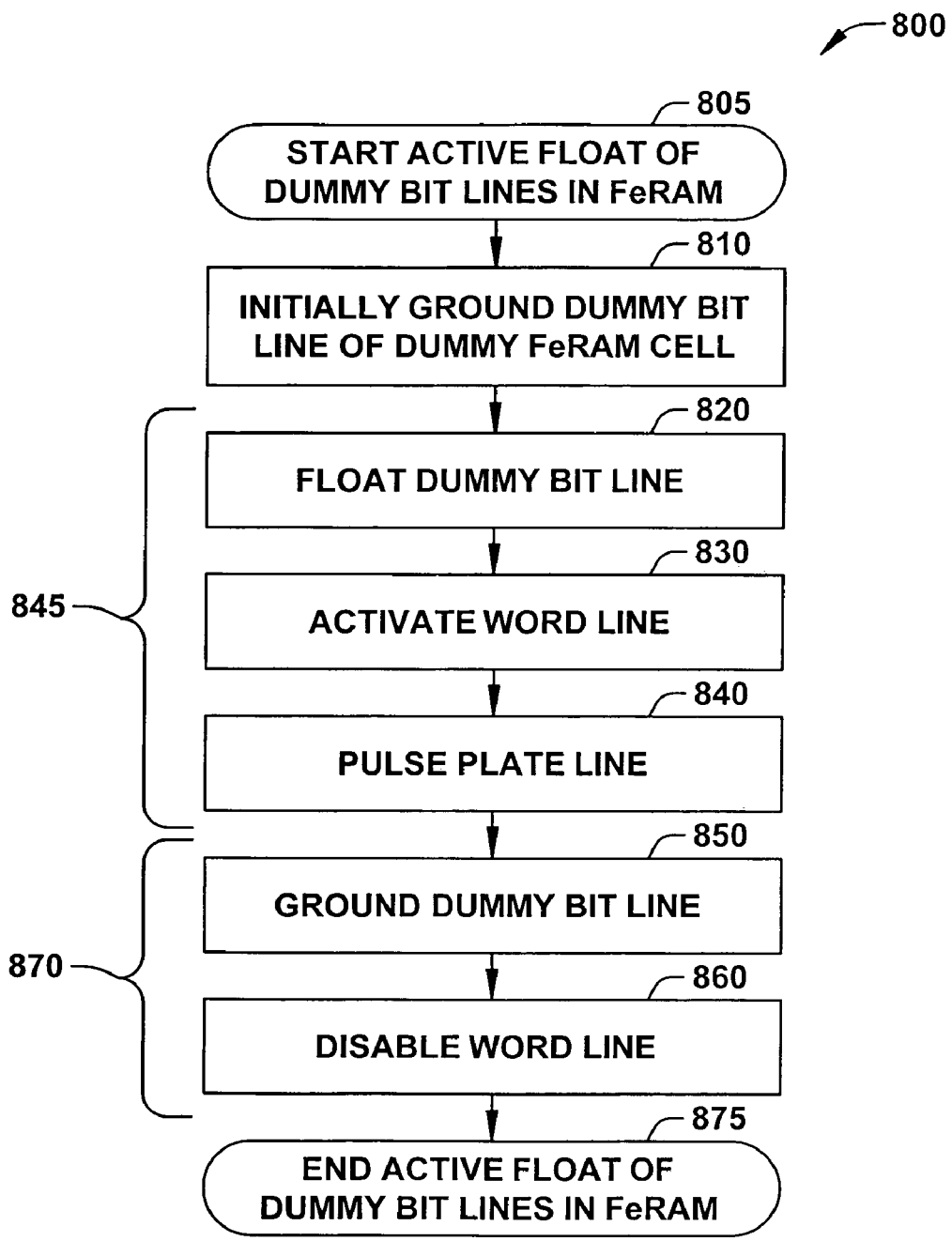
FIGS. 8-10 are flow diagrams of exemplary methods of operating a FeRAM and other such memory devices to avoid over-voltage breakdown of the gate oxide in memory cells along dummy bit lines used around the core region boundary of memory arrays, wherein the methods float the dummy bit line during plate line pulsing activity in accordance with the present invention.
Figure 9:
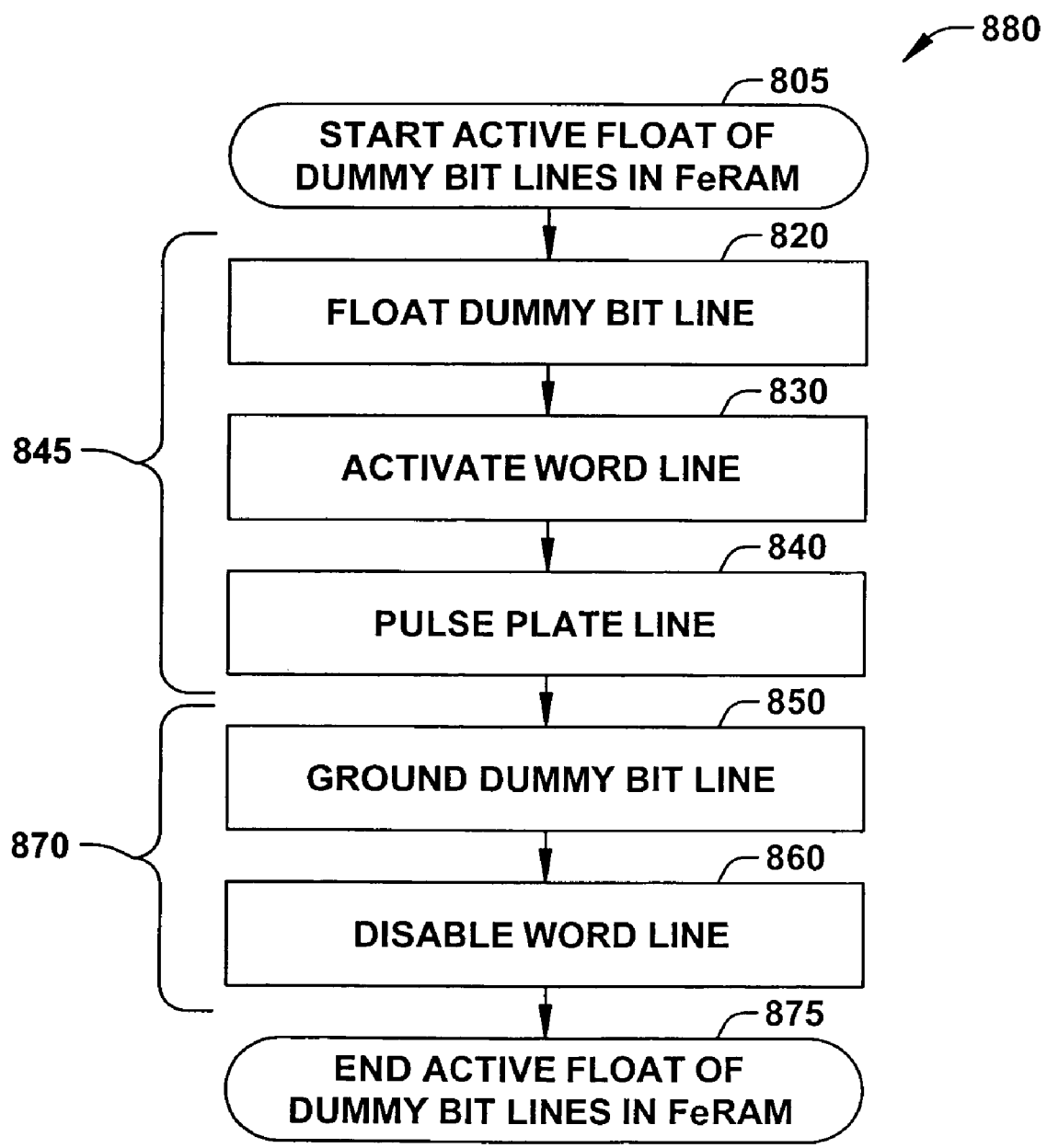
Figure 10:
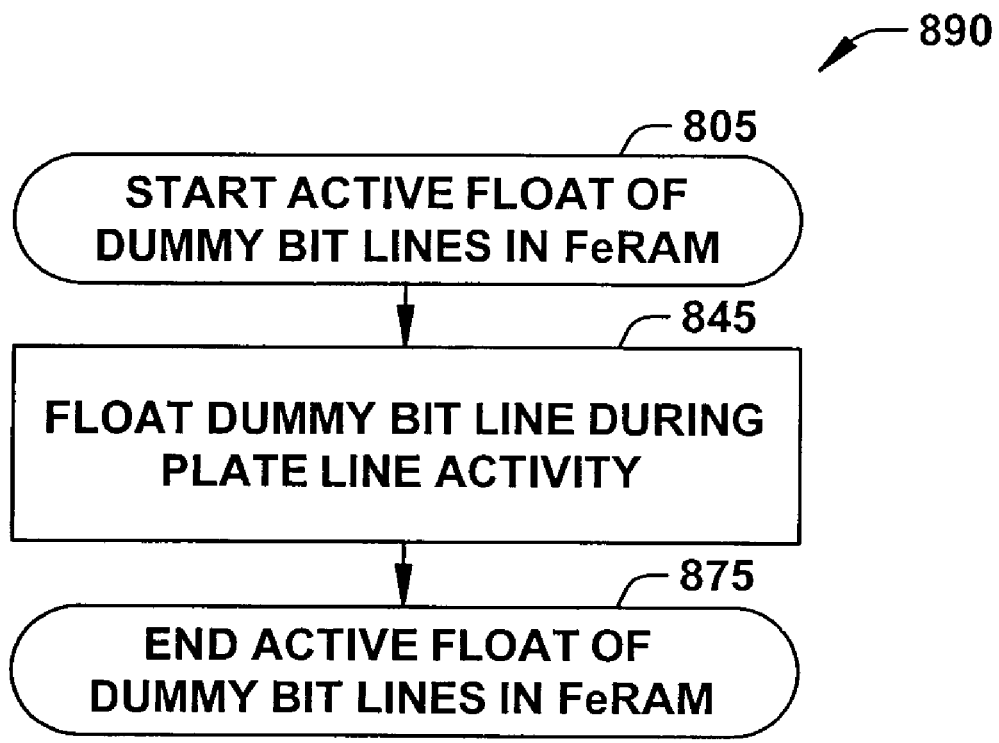

FIGS. 8-10 illustrate exemplary active float methods 800, 880, and 890, respectively, of operating a FeRAM and other such memory devices in accordance with the present invention. The active float methods avoid over-voltage breakdown of the gate oxide in memory cells along dummy bit lines used around the core region boundary of memory arrays, by floating the dummy bit line during plate line pulsing activity. In the context of the present invention, It will be appreciated that "during plate line pulsing activity" may include floating the dummy bit line before, or coincident with, the beginning edge of the plate line pulse, and may further include re-grounding the dummy bit line after, or coincident with, the trailing edge of the plate line pulse.

FIG. 8, for example, illustrates one such active float method 800, of floating the dummy bit line during plate line pulsing for various memory operations in accordance with several aspects of the present invention. Although the exemplary method 800 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and transistor devices illustrated and described herein as well as in association with other apparatus and structures not illustrated.

Method 800 comprises an exemplary active float method 800 that may be used for memory operations of elements of dummy columns (e.g., 202 of FIGS. 2 and 3) and in particular, dummy memory cells (e.g., dummy memory cell 100 of FIGS. 1A and 6), and dummy bit lines (e.g., 118 of FIGS. 1A and 6), the method beginning at 805. The dummy bit line BL 118 associated with one of a plurality of dummy cells 100 is initially grounded at 810. For example, a bit line precharge transistor (e.g., 610 of FIG. 6) within a dummy sense amplifier (e.g., 604 of FIG. 6, or 210 of FIG. 3) may be used to ground bit line BL 118 via dummy SA bit line DSABL 250 and bit line isolation transistor 230. Initially grounding BL 118 is a preferred initial pre-condition so that the storage node voltage starts at ground when the plate line is pulsed. However, this pre-condition may also be considered optional (see method 880) as the dummy bit line BL 118 will hereafter be allowed to float, and the storage capacitor may be discharged by another alternate path, and/or may be considered initially discharged.

At 820, the dummy bit line 118 is allowed to float, for example, by turning off the bit line precharge transistor 610. Then, at 830 a word line voltage VWL is applied to the word line 116 to select and activate the gate of pass transistor 112. At 840 the plate line PL 120 is pulsed, for example, with a positive going pulse 735, wherein the storage node SN 125 is capacitively coupled to the plate line PL 120. Beneficially, however, the floating bit line BL 118, is allowed to couple freely high and low with the storage node SN 125, thereby preventing a negative voltage at SN 125 and avoiding an overvoltage across the gate to source Vgs of pass transistor 112. Together, steps 820, 830 and 840 collectively comprise floating the dummy bit line during plate line pulsing activities, step 845.

The dummy bit line BL 118 is again grounded at 850, for example using the blprc transistor 610. At 860 the word line WL 116 is disabled, thereby deselecting the dummy cell 100. Together, steps 850 and 860 collectively comprise step 870, an optional post-condition of the above active float operation, or an optional pre-condition for the next such operation. Thereafter, the active float method 800 ends at 875.

FIG. 9 illustrates another exemplary active float method 880, similar to that of FIG. 8, and as such need not be completely described again for the sake of brevity. As indicated above, the optional pre-condition 810 step of initially grounding the bit line BL 118 to provide a discharge path to ground for the storage capacitor is eliminated from method 880. This is possible because the dummy bit line BL 118 will hereafter be allowed to float, and the storage capacitor may be discharged by another alternate path, and/or may be considered initially discharged. Alternately, a positive voltage applied to the dummy bit line prior to floating it may actually reduce the gate to source and gate to drain voltage during the time the plate line is pulsed. Further, in a prior art, the dummy cells only needed to be disabled, and this was done by continuously grounding the bit lines. Thereafter, steps 820 through 875 proceed as in method 800.

Similarly, FIG. 10 illustrates yet another exemplary active float method 890, similar to that of FIGS. 8 and 9, and as such need not be completely described again for the sake of brevity. In method 890 steps 820, 830 and 840 are illustrated as the combined step 845 of floating the dummy bit line during plate line pulsing activities. In addition, the optional post-condition of the above active float operation, or an optional pre-condition for the next such operation, steps 850 and 860 (or step 870) are also eliminated, by considering that these pre-conditions may be provided by other means for the next such memory operation. Thus, it will be appreciated that the active floating of the bit lines during plate line activity (steps 820, 830 and 840, or combined step 845) provides the minimum requirements of the methods of the present invention.

It will be noted that the various aspects of methods 800, 880, and 890 illustrated and described above are exemplary in nature, and that many alternative orderings of various active dummy bit line floating steps may be made in accordance with the spirit and scope of the present invention. The step order in the method 845 of FIGS. 8-9 may be such that step 830 precedes step 820. The method described is equally applicable to the 2T2C configuration. Where more that one dummy bit line is used, two or more dummy bit lines could be shorted together without departing from the spirit and scope of the present invention. In addition, the invention is not limited to the specific memory technologies discussed herein, and may be implemented in association with other memory architectures wherein storage capacitors, pass transistors, plate lines, bit lines and wordlines are used in the memory cells in the fabrication of semiconductor products.

The invention is also not limited to the use of dummy columns and FeRAM, and may be implemented in association with the manufacture of various semiconductor devices, dummy rows, or other dummy element groupings of an array, wherein the various aspects thereof may be applied. The invention could be used on any non-active column(s) or bit line(s) that need not be at the outer periphery region of the active (core) array used to store the data. Non-active (dummy) column(s) or bit line(s) could be surrounded by active column(s) or bit line(s) on one or both sides.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method for operating a dummy memory cell having a plate line, a dummy bit line, a pass transistor, a storage node and a storage capacitor, the storage capacitor connected between the plate line and the storage node and the pass transistor connected between the storage node and the dummy bit line, the method comprising:
   floating the dummy bit line during plate line pulsing activity;
   wherein a sense amplifier connected to a memory cell that is coupled to the plate line in a core region of an array is not connected to the dummy bit line.

2. The method of claim 1, further comprising initially grounding the dummy bit line before floating the dummy bit line.

3. The method of claim 1, wherein floating the dummy bit line during plate line pulsing activity comprises:
   floating the dummy bit line;
   activating a word line associated with the pass transistor of the dummy memory cell to couple the storage node to the floating dummy bit line; and
   pulsing the plate line after activating the word line.

4. The method of claim 3, further comprising:
   grounding the dummy bit line after pulsing the plate line; and
   disabling the word line after grounding the dummy bit line.

5. The method of claim 1, wherein floating the dummy bit line during plate line pulsing activity comprises floating the dummy bit line before, or coincident with the beginning edge of a plate line pulse, and grounding the dummy bit line after, or coincident with the trailing edge of the plate line pulse.

6. The method of claim 1, wherein the dummy bit line is grounded when the plate line is not pulsing.

7. The method of claim 1, wherein the dummy memory cell is a FeRAM memory cell.

8. The method of claim 1, wherein the dummy memory cell is a FeRAM memory cell, and the storage capacitor is a ferroelectric capacitor.

9. The method of claim 1, wherein a bit line precharge transistor is used for grounding of the dummy bit line.

10. The method of claim 9, wherein the bit line precharge transistor is an integral part of a sense amplifier associated with the dummy bit line.

11. The method of claim 1, wherein a bit line precharge transistor is used for the floating and grounding of the dummy bit line.

12. The method of claim 11, wherein the bit line precharge transistor is an integral part of a sense amplifier associated with the dummy bit line.

13. The method of claim 1, wherein the dummy memory cell is a FeRAM memory cell and wherein the pass transistor is an n-channel transistor.

14. The method of claim 1, wherein one or more dummy bit lines are used in a FeRAM array.

15. The method of claim 14, wherein two or more dummy bit lines are coupled together.

16. The method of claim 1, wherein the floating the dummy bit line during plate line pulsing activity comprises:
   activating a word line associated with the dummy memory cell to couple the storage node to the dummy bit line;
   floating the dummy bit line after activating the word line; and
   pulsing the plate line after activating the word line.

17. The method of claim 16, further comprising:
   grounding the dummy bit line after pulsing the plate line; and
   disabling the word line after grounding the dummy bit line.

18. A method for operating a FeRAM dummy cell having a plate line, a dummy bit line, a pass transistor, a storage node and a ferroelectric storage capacitor, the ferroelectric storage capacitor connected between the plate line and the storage node and the pass transistor connected between the storage node and the dummy bit line, the method comprising:
   initially grounding the dummy bit line;
   floating the dummy bit line;
   activating a word line associated with the pass transistor of the FeRAM dummy cell to couple the storage node to the dummy bit line after floating the dummy bit line; and
   pulsing the plate line after activating the word line.

19. The method of claim 18, further comprising grounding the dummy bit line after pulsing the plate line.

20. The method of claim 19, further comprising disabling the word line after grounding the dummy bit line.

21. The method of claim 18, wherein the dummy bit line is grounded when the plate line is not pulsing.

22. The method of claim 18, wherein a bit line precharge transistor is used for the floating and grounding of the dummy bit line.

23. The method of claim 22, wherein the bit line precharge transistor is an integral part of a sense amplifier associated with the dummy bit line.

24. The method of claim 18, wherein a bit line precharge transistor is used for the floating of the dummy bit line.

25. The method of claim 24, wherein the bit line precharge transistor is an integral part of a sense amplifier associated with the dummy bit line.

26. The method of claim 18, wherein the pass transistor is an n-channel transistor.

27. The method of claim 18, wherein one or more dummy bit lines are used in a FeRAM array.

28. The method of claim 27, wherein two or more dummy bit lines are coupled together.

29. The method of claim 18, wherein the floating the dummy bit line during plate line pulsing activity comprises:
   activating a word line associated with the memory cell to couple the storage node to the dummy bit line;
   floating the dummy bit line after activating the word line; and
   pulsing the plate line after activating the word line.

30. The method of claim 29, further comprising:
   grounding the dummy bit line after pulsing the plate line; and
   disabling the word line after grounding the dummy bit line.

31. A method for operating a dummy memory cell having a plate line, a dummy bit line, a pass transistor, a storage node and a storage capacitor, the storage capacitor connected between the plate line and the storage node and the pass transistor connected between the storage node and the dummy bit line, the method comprising:
   applying a positive voltage bias to the dummy bit line when the plate line is not pulsing;
   activating a word line associated with the pass transistor to couple the storage node to the dummy bit line; and
   pulsing the plate line after activating the word line.

32. The method of claim 31, further comprising initially grounding the dummy bit line before applying the positive voltage bias to the dummy bit line.

33. The method of claim 31, further comprising floating the dummy bit line after applying the positive voltage bias to the dummy bit line.

34. The method of claim 31, further comprising floating the dummy bit line after activating the word line.

35. The method of claim 31, further comprising grounding the dummy bit line after pulsing the plate line.

36. The method of claim 35, further comprising disabling the word line after grounding the dummy bit line.

37. The method of claim 31, further comprising applying the positive voltage to the dummy bit line after pulsing the plate line.

38. The method of claim 37, further comprising disabling the word line when the positive voltage is applied to the dummy bit line.

39. The method of claim 33, wherein a bit line precharge transistor is used for the floating and applying the positive voltage to the dummy bit line.

40. The method of claim 39, wherein the bit line precharge transistor is an integral part of a sense amplifier associated with the dummy bit line.

41. The method of claim 31, wherein a bit line precharge transistor is used for applying the positive voltage to the dummy bit line.

42. The method of claim 41, wherein the bit line precharge transistor is an integral part of a sense amplifier associated with the dummy bit line.

43. The method of claim 31, wherein the dummy memory cell is a FeRAM memory cell, and the storage capacitor is a ferroelectric capacitor.

44. The method of claim 31, wherein one or more dummy bit lines are used in a FeRAM array.

45. The method of claim 44, wherein two or more dummy bit lines are coupled together.

* * * * *